United States Patent
Cho

(10) Patent No.: US 11,164,653 B2
(45) Date of Patent: Nov. 2, 2021

(54) REPAIR ANALYSIS CIRCUIT AND MEMORY INCLUDING THE SAME

(71) Applicant: SK hynix Inc., Gyeonggi-do (KR)

(72) Inventor: Hosung Cho, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/889,426

(22) Filed: Jun. 1, 2020

(65) Prior Publication Data

US 2021/0193251 A1 Jun. 24, 2021

(30) Foreign Application Priority Data

Dec. 20, 2019 (KR) .................. 10-2019-0171654

(51) Int. Cl.
*G11C 29/44* (2006.01)
*G11C 29/18* (2006.01)
*G11C 29/14* (2006.01)
*G11C 29/00* (2006.01)

(52) U.S. Cl.
CPC ............... *G11C 29/44* (2013.01); *G11C 29/14* (2013.01); *G11C 29/18* (2013.01); *G11C 29/76* (2013.01); *G11C 2029/4402* (2013.01)

(58) Field of Classification Search
CPC ......... G11C 29/44; G11C 29/76; G11C 29/14; G11C 29/18; G11C 2029/4402
See application file for complete search history.

(56) References Cited

U.S. PATENT DOCUMENTS

| | | | |
|---|---|---|---|
| 7,908,527 B2* | 3/2011 | Kohara | G11C 29/848 714/711 |
| 8,743,637 B2* | 6/2014 | Matsuo | G11C 29/848 365/200 |
| 8,909,891 B2 | 12/2014 | Reed et al. | |
| 10,296,417 B2* | 5/2019 | Gilda | G11C 29/52 |
| 10,339,042 B2* | 7/2019 | Oh | G11C 29/76 |
| 10,346,240 B2* | 7/2019 | Han | G06F 11/0793 |
| 10,395,749 B2* | 8/2019 | Kang | G11C 29/4401 |
| 2012/0229155 A1 | 9/2012 | Anzou et al. | |

* cited by examiner

*Primary Examiner* — Tri M Hoang
(74) *Attorney, Agent, or Firm* — IP & T Group LLP

(57) ABSTRACT

A memory may include a first repair analysis circuit suitable for storing an input fail address when the input fail address is different from a fail address which is already stored in the first repair analysis circuit, and outputting the input fail address as a first transfer fail address when a storage capacity of the first repair analysis circuit is full; and a second repair analysis circuit suitable for storing the first transfer fail address when the first transfer fail address is different from a fail address which is already stored in the second repair analysis circuit.

3 Claims, 14 Drawing Sheets

FIG. 2

| BIRA_MODE[2:0] | Mode | Mode Description |
|---|---|---|
| 000 | 1CH_BANK | 1BIRA per bank used for 1 selected channel |
| 001 | 1CH_RANK | 2BIRA per bank used for 1 selected channel |
| 010 | 1CH_ALL | 4BIRA used for 1 selected channel |
| 011 | 2CH_RANK | 1BIRA per rank used for 2 selected channels |
| 100 | 2CH_ALL | 2BIRA used for each of 2 selected channels |
| 101 | 4CH_ALL | 1BIRA used for each of all channels |

FIG. 3

| Mode | MUX1 | MUX2 | MUX3 | CH_SEL[1:0] | Configuration |
|---|---|---|---|---|---|
| 1CH_BANK | 0 | 0 | 0 | 00 | CHA BANK0-BIRA0, CHA BANK1-BIRA1, CHA BANK2-BIRA2, CHA BANK3-BIRA3 |
| | | | | 01 | CHB BANK0-BIRA0, CHB BANK1-BIRA1, CHB BANK2-BIRA2, CHB BANK3-BIRA3 |
| | | | | 10 | CHC BANK0-BIRA0, CHC BANK1-BIRA1, CHC BANK2-BIRA2, CHC BANK3-BIRA3 |
| | | | | 11 | CHD BANK0-BIRA0, CHD BANK1-BIRA1, CHD BANK2-BIRA2, CHD BANK3-BIRA3 |
| 1CH_RANK | 1 | 0 | 1 | 00 | CHA RANK0-BIRA0/BIRA1, CHA RANK1-BIRA2/BIRA3 |
| | | | | 01 | CHB RANK0-BIRA0/BIRA1, CHB RANK1-BIRA2/BIRA3 |
| | | | | 10 | CHC RANK0-BIRA0/BIRA1, CHC RANK1-BIRA2/BIRA3 |
| | | | | 11 | CHD RANK0-BIRA0/BIRA1, CHD RANK1-BIRA2/BIRA3 |
| 1CH_ALL | 1 | 1 | 1 | 00 | CHA-BIRA0/BIRA1/BIRA2/BIRA3 |
| | | | | 01 | CHB-BIRA0/BIRA1/BIRA2/BIRA3 |
| | | | | 10 | CHC-BIRA0/BIRA1/BIRA2/BIRA3 |
| | | | | 11 | CHD-BIRA0/BIRA1/BIRA2/BIRA3 |
| CH_RANK | 0 | 0 | 0 | 00 | CHA RANK0-BIRA0, CHA RANK1-BIRA1, CHB RANK0-BIRA2, CHB RANK1-BIRA3 |
| | | | | 01 | CHC RANK0-BIRA0, CHC RANK1-BIRA1, CHD RANK0-BIRA2, CHD RANK1-BIRA3 |
| | | | | 10 | CHA RANK0-BIRA0, CHA RANK1-BIRA1, CHC RANK0-BIRA2, CHC RANK1-BIRA3 |
| | | | | 11 | CHB RANK0-BIRA0, CHB RANK1-BIRA1, CHD RANK0-BIRA2, CHD RANK1-BIRA3 |
| 2CH_ALL | 1 | 0 | 1 | 00 | CHA-BIRA0/BIRA1, CHB-BIRA2/BIRA3 |
| | | | | 01 | CHC-BIRA0/BIRA1, CHD-BIRA2/BIRA3 |
| | | | | 10 | CHA-BIRA0/BIRA1, CHC-BIRA2/BIRA3 |
| | | | | 11 | CHB-BIRA0/BIRA1, CHD-BIRA2/BIRA3 |
| 4CH_ALL | 0 | 0 | 0 | Don't care | CHA-BIRA0, CHB-BIRA1, CHC-BIRA2, CHD-BIRA3 |

FIG. 4

| Mode | CH_SEL | CMP_FAIL0[3:0] | CMP_FAIL1[3:0] | CMP_FAIL2[3:0] | CMP_FAIL3[3:0] |
|---|---|---|---|---|---|
| 1CH_BANK | 00 | CMP_FAIL[3:0][a]&BANK0 | CMP_FAIL[3:0][a]&BANK1 | CMP_FAIL[3:0][a]&BANK2 | CMP_FAIL[3:0][a]&BANK3 |
| | 01 | CMP_FAIL[3:0][b]&BANK0 | CMP_FAIL[3:0][b]&BANK1 | CMP_FAIL[3:0][b]&BANK2 | CMP_FAIL[3:0][b]&BANK3 |
| | 10 | CMP_FAIL[3:0][c]&BANK0 | CMP_FAIL[3:0][c]&BANK1 | CMP_FAIL[3:0][c]&BANK2 | CMP_FAIL[3:0][c]&BANK3 |
| | 11 | CMP_FAIL[3:0][d]&BANK0 | CMP_FAIL[3:0][d]&BANK1 | CMP_FAIL[3:0][d]&BANK2 | CMP_FAIL[3:0][d]&BANK3 |
| 1CH_RANK | 00 | CMP_FAIL[3:0][a]&RANK0 | X | CMP_FAIL[3:0][a]&RANK1 | X |
| | 01 | CMP_FAIL[3:0][b]&RANK0 | X | CMP_FAIL[3:0][b]&RANK1 | X |
| | 10 | CMP_FAIL[3:0][c]&RANK0 | X | CMP_FAIL[3:0][c]&RANK1 | X |
| | 11 | CMP_FAIL[3:0][d]&RANK0 | X | CMP_FAIL[3:0][d]&RANK1 | X |
| 1CH_ALL | 00 | CMP_FAIL[3:0][a] | X | X | X |
| | 01 | CMP_FAIL[3:0][b] | X | X | X |
| | 10 | CMP_FAIL[3:0][c] | X | X | X |
| | 11 | CMP_FAIL[3:0][d] | X | X | X |
| 2CH_RANK | 00 | CMP_FAIL[3:0][a]&RANK0 | CMP_FAIL[3:0][a]&RANK1 | CMP_FAIL[3:0][a]&RANK0 | CMP_FAIL[3:0][a]&RANK1 |
| | 01 | CMP_FAIL[3:0][b]&RANK0 | CMP_FAIL[3:0][b]&RANK1 | CMP_FAIL[3:0][b]&RANK0 | CMP_FAIL[3:0][b]&RANK1 |
| | 10 | CMP_FAIL[3:0][c]&RANK0 | CMP_FAIL[3:0][c]&RANK1 | CMP_FAIL[3:0][c]&RANK0 | CMP_FAIL[3:0][c]&RANK1 |
| | 11 | CMP_FAIL[3:0][d]&RANK0 | CMP_FAIL[3:0][d]&RANK1 | CMP_FAIL[3:0][d]&RANK0 | CMP_FAIL[3:0][d]&RANK1 |
| 2CH_ALL | 00 | CMP_FAIL[3:0][a] | X | CMP_FAIL[3:0][b] | X |
| | 01 | CMP_FAIL[3:0][c] | X | CMP_FAIL[3:0][d] | X |
| | 10 | CMP_FAIL[3:0][a] | X | CMP_FAIL[3:0][c] | X |
| | 11 | CMP_FAIL[3:0][b] | X | CMP_FAIL[3:0][d] | X |
| 4CH_ALL | Don't care | CMP_FAIL[3:0][a] | CMP_FAIL[3:0][b] | CMP_FAIL[3:0][c] | CMP_FAIL[3:0][d] |

REPAIR ANALYSIS CIRCUIT AND MEMORY INCLUDING THE SAME

CROSS-REFERENCE TO RELATED APPLICATION

This application claims priority under 35 U.S.C. § 119 to Korean Patent Application No. 10-2019-0171654 filed on Dec. 20, 2019, which is incorporated herein by reference in its entirety.

BACKGROUND

1. Field

This patent document relates to a memory, and more particularly, to a repair analysis circuit of a memory.

2. Discussion of the Related Art

At the initial stage of the memory semiconductor industry, a lot of original good dies each having no defective cells in a memory chip having passed through a semiconductor fabrication process have been distributed on a wafer. However, the increase in capacity of memories has made it difficult to fabricate a memory chip having no defective cells. Currently, there is almost no probability that such a memory chip will be fabricated.

To overcome such a situation, a method of installing a spare memory, i.e. a redundancy memory to repair (replace) a defective cell, has been suggested. In order to repair a defective cell, the defective cell needs to be detected through a test. Then, the detected defective cell needs to be analyzed and stored. Recently, a repair analysis circuit for analyzing and storing information for a found defective cell is being installed in a memory.

SUMMARY

Various embodiments are directed to a technology capable of analyzing and storing a fail address using an efficient method.

In an embodiment, a memory may include: a first repair analysis circuit suitable for storing an input fail address when the input fail address is different from a fail address which is already stored in the first repair analysis circuit, and outputting the input fail address as a first transfer fail address when a storage capacity of the first repair analysis circuit is full; and a second repair analysis circuit suitable for storing the first transfer fail address when the first transfer fail address is different from a fail address which is already stored in the second repair analysis circuit.

In an embodiment, a memory may include: first to fourth repair analysis circuits; and a control circuit suitable for: controlling the first to fourth repair analysis circuits to store fail addresses of different regions within the memory in a first mode, and controlling the first and second repair analysis circuits to store a fail address indicating one region within the memory and controlling the third and fourth repair analysis circuits to store a fail address indicating another region within the memory, in a second mode.

In an embodiment, a memory may include: a control circuit suitable for receiving an address set including one or more addresses and fail information indicating whether the address set is a fail, and generating first to fourth fail information and first to third selection signals; a first repair analysis circuit suitable for receiving the address set and the first fail information, storing a fail address of the address set and designated by the first fail information when the fail address is different from a fail address which is already stored in the first repair analysis circuit, and generating first transfer fail information indicating the fail address which the first repair analysis circuit does not store due to a capacity limit; a first selection circuit suitable for selecting and outputting one of the second fail information and the first transfer fail information in response to the first selection signal; a second repair analysis circuit suitable for receiving the address set and the fail information selected by the first selection circuit, storing a fail address of the address set and designated by the fail information selected by the first selection circuit when the fail address is different from a fail address which is already stored in the second repair analysis circuit, and generating second transfer fail information indicating the fail address which the second repair analysis circuit does not store due to a capacity limit; a second selection circuit suitable for selecting and outputting one of the third fail information and the second transfer fail information in response to the second selection signal; a third repair analysis circuit suitable for receiving the address set and the fail information selected by the second selection circuit, storing a fail address of the address set and designated by the fail information selected by the second selection circuit when the fail address is different from a fail address which is already stored in the third repair analysis circuit, and generating third transfer fail information indicating the fail address which the third repair analysis circuit does not store due to a capacity limit; a third selection circuit suitable for selecting and outputting one of the fourth fail information and the third transfer fail information in response to the third selection signal; and a fourth repair analysis circuit suitable for receiving the address set and the fail information selected by the third selection circuit, and storing a fail address of the address set and designated by the fail information selected by the third selection circuit when the fail address is different from a fail address which is already stored in the fourth repair analysis circuit.

In an embodiment, a repair analysis circuit may include: first to $X^{th}$ repair address registers each suitable for storing a fail address therein where X is an integer equal to or greater than 2; and a redundancy check circuit suitable for receiving an input address set including one or more addresses and input fail information indicating whether the input address set is a fail, and checking whether a fail address within the input address set is same as one of fail addresses already stored in the first to $X^{th}$ repair address registers, wherein when it is determined that the fail address within the input address set is different from one of the fail addresses already stored in the first to $X^{th}$ repair address registers, the corresponding fail address is stored in an empty repair address register among the first to $X^{th}$ repair address registers.

In an embodiment a memory may include: a first-stage circuit suitable for storing or bypassing a first signal, which is not yet stored therein, the first signal being bypassed when a storage of the first-stage circuit is full of signals; one or more intermediate-stage circuits each suitable for storing or bypassing a selected signal, which is between a bypassed signal from a previous-stage circuit and a corresponding signal and not yet stored therein, the selected signal being bypassed when a storage of the intermediate-stage circuit is full of signals; and a last-stage circuit suitable for storing a selected signal, which is between the bypassed signal from a previous-stage circuit and a last signal and not yet stored therein.

In accordance with the present embodiments, the memory and the repair analysis circuit can analyze and store a fail address efficiently.

BRIEF DESCRIPTION OF THE DRAWINGS

FIG. 2 is a table illustrating the titles of modes selected by mode information and the descriptions of the modes.

FIG. 3 is a table illustrating how first to third selection signals are generated and how first to fourth repair analysis circuits are used, according to the modes and channel selection information.

FIG. 4 is a table illustrating how a control circuit generates first fail information, second fail information, third fail information and fourth fail information according to the modes and the channel selection information.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
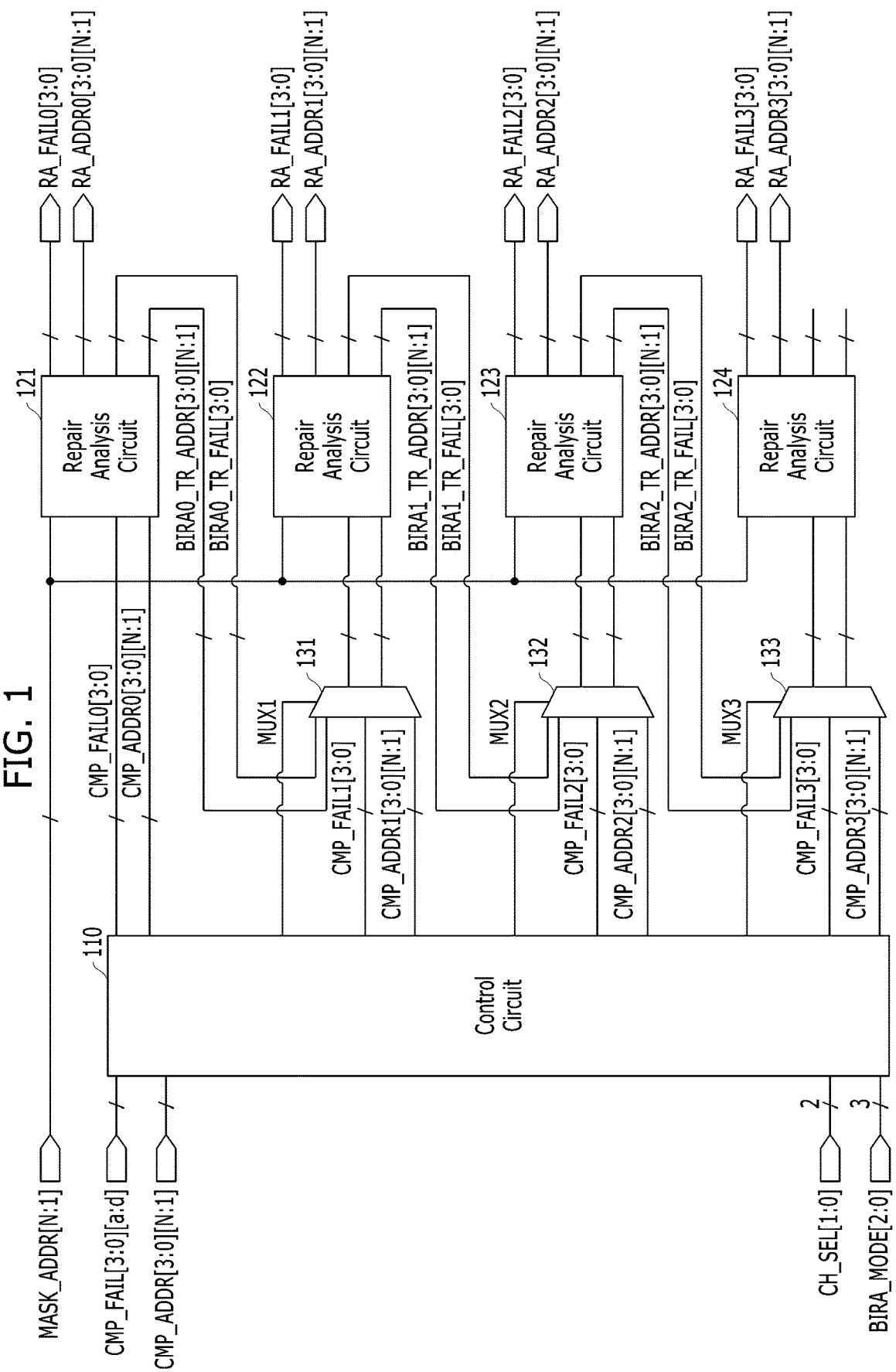
FIG. 1 is a configuration diagram illustrating a memory in accordance with an embodiment.

FIG. 1 is a configuration diagram illustrating a memory in accordance with an embodiment. FIG. 1 illustrates only parts related to analysis and storage of a repair address in the memory.

Hereafter, the memory has four channels however any number of channels may be used. Here, a channel is a system independent from another system. The channel is independently operable in response to commands, addresses and data, which are independent from other commands, addresses and data. For example, a 4-channel memory may be considered to include four memories which operate independently from one another. Furthermore, each of the channels includes two ranks, and each of the ranks includes four banks however any number of ranks and banks may be used. That is, the memory includes four channels, and each of the channels includes eight banks. However, the above-described examples are for convenience of description, and the number of channels, ranks and banks may be differently set.

As illustrated in FIG. 1, the memory includes a control circuit 110, first to fourth repair analysis circuits 121 to 124 and first to third selection circuits 131 to 133.

The control circuit 110 may control operations of the first to fourth repair analysis circuits 121 to 124. The control operation of the control circuit 110 may be performed in different manners depending on modes. The control circuit 110 may receive an address set CMP_ADDR[3:0][N:1], fail information CMP_FAIL[3:0][a:d], mode information BIRA_MODE[2:0] and channel selection information CH_SEL[1:0]. Here, the address set CMP_ADDR[3:0][N:1] and the fail information CMP_FAIL[3:0][a:d] may be results obtained through a test by a test circuit such as a Built-In Self Test (BIST) circuit, and the mode information BIRA_MODE[2:0] and the channel selection information CH_SEL[1:0] may be information decided by settings during a test operation.

The fail information CMP_FAIL[3:0][a:d] is information indicating whether the address set CMP_ADDR[3:0][N:1] is a fail. That is, an address within the address set CMP_ADDR[3:0][N:1] and designated as a fail by the fail information CMP_FAIL[3:0][a:d] may be a fail address. In the fail information CMP_FAIL[3:0][a:d], [3:0] may represent four ports 0 to 3, and [a:d] may represent four channels A to D. The address set CMP_ADDR[3:0][N:1] may indicate an N-bit address inputted to the respective ports 0 to 3. The N-bit address may include a 1-bit rank address, a 2-bit bank address and an (N-3)-bit normal address (low-order address of the bank address). When CMP_FAIL[2][b] of the fail information CMP_FAIL[3:0][a:d] has a value of '1', it may indicate that an N-bit address CMP_ADDR[2][N:1] inputted to the port 2 is a fail address of the channel B. When CMP_FAIL[2][b] of the fail information CMP_FAIL[3:0][a:d] has a value of '0', it may indicate that the N-bit address CMP_ADDR[2][N:1] inputted to the port 2 is not a fail address of the channel B. Similarly, when CMP_FAIL[0][a] has a value of '1', it may indicate that an N-bit address CMP_ADDR[0][N:1] inputted to the port 0 is a fail address of the channel A.

The mode information BIRA_MODE[2:0] may be composed of three bits, and used to indicate one operation mode of six operation modes. The channel selection information CH_SEL[1:0] may be composed of 2 bits, and used to select one or more channels among the channels A to D in some modes of the six operation modes.

The control circuit 110 may output address sets CMP_ADDR0[3:0][N:1], CMP_ADDR1[3:0][N:1], CMP_ADDR2[3:0][N:1] and CMP_ADDR3[3:0][N:1], first to fourth fail information CMP_FAIL0[3:0], CMP_FAIL1[3:0], CMP_FAIL2[3:0] and CMP_FAIL3[3:0] and first to third selection signals MUX1 to MUX3. Each of the address sets CMP_ADDR0[3:0][N:1], CMP_ADDR1[3:0][N:1], CMP_ADDR2[3:0][N:1] and CMP_ADDR3[3:0][N:1] outputted from the control circuit 110 may be the same as the address set CMP_ADDR[3:0][N:1] inputted to the control circuit 110. Since the first to fourth fail information CMP_FAIL0[3:0], CMP_FAIL1[3:0], CMP_FAIL2[3:0] and CMP_FAIL3[3:0] outputted from the control circuit 110 are generated through the fail information CMP_FAIL[3:0][a:d] inputted to the control circuit 110, the first to fourth fail information CMP_FAIL0[3:0], CMP_FAIL1[3:0], CMP_FAIL2[3:0] and CMP_FAIL3[3:0] may be changed depending on the modes. The first to third selection signals MUX1 to MUX3 may be signals for controlling selection operations of the first to third selection circuits 131 to 133.

Each of the first to fourth repair analysis circuits 121 to 124 may store an input fail address when the input fail address is different from a fail address which is already stored therein, and output or bypass the input fail address as a transfer fail address when the storage capacity of the repair analysis circuit is full, i.e., cannot store any more fail addresses. For example, the first repair analysis circuit 121 may store a fail address indicated by the first fail information CMP_FAIL0[3:0] and the address set CMP_ADDR0[3:0][N:1] when the fail address is different from a fail address which is already stored therein, and output the fail address as a transfer fail address when the storage capacity of the first repair analysis circuit 121 is full. At this time, the transfer fail address may be outputted in the form of a first transfer fail information BIRA0_TR_FAIL[3:0] and first transfer address set BIRA0_TR_ADDR[3:0][N:1].

The first to third selection circuits 131 to 133 may perform a selection operation in response to the first to third selection signals MUX1 to MUX3. For example, the first selection circuit 131 may transfer the first transfer fail information BIRA0_TR_FAIL[3:0] and the first transfer address set BIRA0_TR_ADDR[3:0][N:1], outputted from the first repair analysis circuit 121, to the second repair analysis circuit 122 when the first selection signal MUX1 has a value of '1', and transfer the second fail information CMP_FAIL1[3:0] and the address set CMP_ADDR1[3:0][N:1], outputted from the control circuit 110, to the second repair analysis circuit 122 when the first selection signal MUX1 has a value of '0'.

FIG. 2 is a table showing the titles of modes selected by the mode information BIRA_MODE[2:0] and the descriptions of the modes. When the mode information BIRA_MODE[2:0] is '000', a 1-channel bank mode 1CH_BANK is set. In this mode, one repair analysis circuit per bank is used for one selected channel regardless of ranks. When the mode information BIRA_MODE[2:0] is '001', a 1-channel 1-rank mode 1CH_RANK is set. In this mode, two repair analysis circuits per rank are used for one selected channel. When the mode information BIRA_MODE[2:0] is '010', a 1-channel all mode 1CH_ALL is set. In this mode, one selected channel uses all of the four repair analysis circuits. When the mode information BIRA_MODE[2:0] is '011', a 2-channel rank mode 2CH_RANK is set. In this mode, one repair analysis circuit per rank is used for two selected channels. When the mode information BIRA_MODE[2:0] is '100', a 2-channel all mode 2CH_ALL is set. In this mode, two repair analysis circuits are used for each of two selected channels. When the mode information BIRA_MODE[2:0] is '101', 4-channel all mode 4CH_ALL is set. In this mode, each of all channels uses one repair analysis circuit.

FIG. 3 is a table showing how the first to third selection signals MUX1 to MUX3 are generated and how the first to fourth repair analysis circuits 121 to 124 are used, according to the modes and the channel selection information CH_SEL[1:0].

FIG. 3 shows that, in the 1-channel bank mode 1CH_BANK, a channel selected by the channel selection information CH_SEL[1:0] uses one repair analysis circuit per bank. For example, when the channel selection information CH_SEL[1:0] is '10' in the 1-channel bank mode 1CH_BANK, the channel C may be selected, a zeroth bank CHC BAN KO of the channel C may use the first repair analysis circuit 121 (indicated by "BIRA0" in FIG. 3), a first bank CHC BANK1 of the channel C may use the second repair analysis circuit 122 (indicated by "BIRA1" in FIG. 3), a second bank CHC BANK2 of the channel C may use the third repair analysis circuit 123 (indicated by "BIRA2" in FIG. 3), and a third bank CHC BANK3 of the channel C may use the fourth repair analysis circuit 124 (indicated by "BIRA3" in FIG. 3). Since the first to third selection signals MUX1 to MUX3 are '000' in the 1-channel bank mode 1CH_BANK, the first to fourth repair analysis circuits 121 to 124 may be independently operated.

In the 1-channel rank mode 1CH_RANK, since the first to third selection signals MUX1 to MUX3 are '101', the first and second repair analysis circuits 121 and 122 may operate like one repair analysis circuit, and the third and fourth repair analysis circuits 123 and 124 may operate like one repair analysis circuit. That is, the second repair analysis circuit 122 may receive and store a fail address which the first repair analysis circuit 121 does not store, and the fourth repair analysis circuit 124 may receive and store a fail address which the third repair analysis circuit 123 does not store. In the 1-channel rank mode 1CH_RANK, a channel selected by the channel selection information CH_SEL[1:0] may use two repair analysis circuits per rank. For example, when the channel selection information CH_SEL[1:0] is '01' in the 1-channel rank mode 1CH_RANK, the channel B may be selected, a zeroth rank CHB RANK0 of the channel B may use the first and second repair analysis circuits 121 and 122 ("BIRA0" and "BIRA1"), and a first rank CHB RANK1 of the channel B may use the third and fourth repair analysis circuits 123 and 124 ("BIRA2" and "BIRA3").

In the 1-channel all mode 1CH_ALL, since the first to third selection signals MUX1 to MUX3 are '111', the first to fourth repair analysis circuits 121 to 124 may operate like one repair analysis circuit. That is, the first to fourth repair analysis circuits 121 to 124 may be coupled in series to store a fail address inputted to the first repair analysis circuit 121. In the 1-channel all mode 1CH_ALL, a channel selected by the channel selection information CH_SEL[1:0] may use the four repair analysis circuits. For example, when the channel selection information CH_SEL[1:0] is '11' in the 1-channel all mode 1CH_ALL, the channel D may be selected to use the first to fourth repair analysis circuits 121 to 124 ("BIRA0"/"BIRA1"/"BIRA2"/"BIRA3").

In the 2-channel rank mode 2CH_RANK, since the first to third selection signals MUX1 to MUX3 are '000', the first to fourth repair analysis circuits 121 to 124 may independently operate. In the 2-channel rank mode 2CH_RANK, each of two ranks for each of two channels selected by the channel selection information CH_SEL[1:0] may use one repair analysis circuit. For example, when the channel selection information CH_SEL[1:0] is '10' in the 2-channel rank mode 2CH_RANK, the channel A and the channel C may be selected, the zeroth rank CHA RANK0 of the channel A may use the first repair analysis circuit 121 ("BIRA0"), the first rank CHA RANK1 of the channel A may use the second repair analysis circuit 122 ("BIRA1"), the zeroth bank CHC RANK0 of the channel C may use the third repair analysis circuit 123 ("BIRA2"), and the first rank CHC RANK1 of the channel C may use the fourth repair analysis circuit 124 ("BIRA3").

In the 2-channel all mode 2CH_ALL, since the first to third selection signals MUX1 to MUX3 are '101', the first and second repair analysis circuits 121 and 122 may operate like one repair analysis circuit, and the third and fourth repair analysis circuits 123 and 124 may operate like one repair analysis circuit. In the 2-channel all mode 2CH_ALL, each of two channels selected by the channel selection information CH_SEL[1:0] may use two repair analysis circuits. For example, when the channel selection information CH_SEL[1:0] is '00' in the 2-chanel all mode 2CH_ALL, the channel A and the channel B may be selected, the channel A may use the first and second repair analysis circuits 121 and 122 ("BIRA0" and "BIRA1"), and the channel B may use the third and fourth repair analysis circuits 123 and 124 ("BIRA2" and "BIRA3").

In the 4-channel all mode 4CH_ALL, since the first to third selection signals MUX1 to MUX3 are '000', the first to fourth repair analysis circuits 121 to 124 may independently operate. In the 4-channel all mode 4CH_ALL, the channel selection information CH_SEL[1:0] may be treated as "don't-care information", and each of the four channels may use one repair analysis circuit. That is, the channel A may use the first repair analysis circuit 121 ("BIRA0"), the channel B may use the second repair analysis circuit 122 ("BIRA1"), the channel C may use the third repair analysis circuit 123 ("BIRA2"), and the channel D may use the fourth repair analysis circuit 124 ("BIRA3"), regardless of the channel selection information CH_SEL[1:0].

FIG. 4 is a table showing how the control circuit 110 generates the first to fourth fail information CMP_FAIL0[3:0], CMP_FAIL1[3:0], CMP_FAIL2[3:0] and CMP_FAIL3[3:0] according to the modes and the channel selection information CH_SEL[1:0].

In FIG. 4, symbol "&" indicates that information on the left side of symbol "&" is activated only when a region written on the right side of symbol "&" is selected. For example, when CMP_FAIL0[3:0] is CMP_FAIL[3:0][a]&BANK0, CMP_FAIL0[3:0] is CMP_FAIL[3:0][a] in the case that the zeroth bank is selected by the address set CMP_ADDR[3:0][N:1], but may be deactivated to '0000' in the case that another bank, not the zeroth bank, is selected by the address set. Specifically, when the zeroth bank is selected by CMP_ADDR[3][N:1] of the address set and not selected by CMP_ADDR[0][N:1], CMP_ADDR[1][N:1] and CMP_ADDR[2][N:1] of the address set, CMP_FAIL0[3] may be CMP_FAIL[3][a], and CMP_FAIL0[0] may be '0', CMP_FAIL0[1] may be '0', and CMP_FAIL0[2] may be '0'.

In the 1-channel bank mode 1CH_BANK, since a channel selected by the channel selection information CH_SEL[1:0] uses one repair analysis circuit per bank, fail information of the selected channel, among the fail information CMP_FAIL[3:0][a:d], may be "&"ed with the corresponding bank to generate the first to fourth fail information CMP_FAIL0[3:0], CMP_FAIL1[3:0], CMP_FAIL2[3:0] and CMP_FAIL3[3:0]. For example, when the channel A is selected because the channel selection information CH_SEL[1:0] is '00' in the 1-channel bank mode 1CH_BANK, the first fail information CMP_FAIL0[3:0] may be generated as CMP_FAIL[3:0][a]&BANK0, the second fail information CMP_FAIL1[3:0] may be generated as CMP_FAIL[3:0][a]&BANK1, the third fail information CMP_FAIL2[3:0] may be generated as CMP_FAIL[3:0][a]&BANK2, and the fourth fail information CMP_FAIL3[3:0] may be generated as CMP_FAIL[3:0][a]&BANK3. That is, the fail information of the zeroth bank of the channel A may be transferred to the first repair analysis circuit 121, the fail information of the first bank of the channel A may be transferred to the second repair analysis circuit 122, the fail information of the second bank of the channel A may be transferred to the third repair analysis circuit 123, and the fail information of the third bank of the channel A may be transferred to the fourth repair analysis circuit 124.

In the 1-channel rank mode 1CH_RANK, the first and second repair analysis circuits 121 and 122 may operate like one repair analysis circuit, and the third and fourth repair analysis circuits 123 and 124 may operate like one repair analysis circuit. Thus, the second fail information CMP_FAIL1[3:0] and the fourth fail information CMP_FAIL3[3:0] may not be used. That is, the second fail information CMP_FAIL1[3:0] and the fourth fail information CMP_FAIL3[3:0] do not need to be generated. Since the channel selected by the channel selection information CH_SEL[1:0] uses two repair analysis circuits per rank in the 1-channel rank mode 1CH_RANK, the fail information of the selected channel, among the fail information CMP_FAIL0[3:0][a:d], may be "&"ed with the zeroth rank to generate the first fail information CMP_FAIL0[3:0], and the fail information of the selected channel may be "&"ed with the first rank to generate the third fail information CMP_FAIL2[3:0]. For example, when the channel C is selected in the 1-channel rank mode 1CH_RANK because the channel selection information CH_SEL[1:0] is '10', the first fail information CMP_FAIL0[3:0] may be generated as CMP_FAIL[3:0][c]&RANK0, and the third fail information CMP_FAIL2[3:0] may be generated as CMP_FAIL[3:0][c]&RANK1. That is, the fail information of the zeroth rank of the channel C may be transferred to the first repair analysis circuit 121, and the fail information of the first rank of the channel C may be transferred to the third repair analysis circuit 123.

In the 1-channel all mode 1CH_ALL, since the first to fourth repair analysis circuits 121 to 124 operate like one repair analysis circuit, only the first fail information CMP_FAIL0[3:0] may be used, and the other pieces of fail information CMP_FAIL1[3:0], CMP_FAIL2[3:0] and CMP_FAIL3[3:0] may not be used. Since a selected channel uses the four repair analysis circuits 121 to 124 in the 1-channel all mode 1CH_ALL regardless of the ranks and the banks, the first fail information CMP_FAIL0[3:0] may be generated as the same information as fail information selected by the channel selection information CH_SEL[1:0] from the fail information CMP_FAIL[3:0][a:d]. For example, when the channel D is selected because the channel selection information CH_SEL[1:0] is '11' in the 1-channel all mode 1CH_ALL, the first fail information CMP_FAIL0[3:0] may be generated as CMP_FAIL[3:0][d]. That is, the fail information of the channel D may be transferred to the first repair analysis circuit 121.

In the 2-channel rank mode 2CH_RANK, since two channels selected by the channel selection information CH_SEL[1:0] use one repair analysis circuit per rank, the fail information of the selected channels, among the fail information CMP_FAIL[3:0][a:d], may be "&"ed with the zeroth rank to generate the first fail information CMP_FAIL0[3:0] and the third fail information CMP_FAIL2[3:0], and the fail information of the selected channels, among the fail information CMP_FAIL[3:0][a:d], may be "&"ed with the first rank to generate the second fail information CMP_FAIL1[3:0] and the fourth fail information CMP_FAIL3[3:0]. For example, when the channels C and D are selected because the channel selection information CH_SEL[1:0] is '01' in the 2-channel rank mode 2CH_RANK, the first fail information CMP_FAIL0[3:0] may be generated as CMP_FAIL[3:0][c]&RANK0, the second fail information CMP_FAIL1[3:0] may be generated as CMP_FAIL[3:0][c]&RANK1, the third fail information CMP_FAIL2[3:0] may be generated as CMP_FAIL[3:0][d]&RANK0, and the fourth fail information CMP_FAIL3[3:0] may be generated as CMP_FAIL[3:0][d]&RANK1. That is, the fail information of the zeroth rank of the channel C may be transferred to the first repair analysis circuit 121, the fail information of the first rank of the channel C may be transferred to the second repair analysis circuit 122, the fail information of the zeroth rank of the channel D may be transferred to the third repair analysis circuit 123, and the fail information of the first rank of the channel D may be transferred to the fourth repair analysis circuit 124.

In the 2-channel all mode 2CH_ALL, the first and second repair analysis circuits 121 and 122 may operate like one repair analysis circuit, and the third and fourth repair analysis circuits 123 and 124 may operate like one repair analysis circuit. Thus, the second fail information CMP_FAIL1[3:0] and the fourth fail information CMP_FAIL3[3:0] may not be used. In the 2-channel all mode 2CH_ALL, fail information of two channels selected by the channel selection information CH_SEL[1:0], among the fail information CMP_FAIL [3:0][a:d], may be generated as the first fail information CMP_FAIL0[3:0] and the third fail information CMP_FAIL2[3:0]. For example, when the channels A and B are selected because the channel selection information CH_SEL[1:0] is '00' in the 2-channel all mode 2CH_ALL, the first fail information CMP_FAIL0[3:0] may be generated as CMP_FAIL[3:0][a], and the third fail information CMP_FAIL2[3:0] may be generated as CMP_FAIL[3:0][b]. That is, the fail information of the channel A may be transferred to the first repair analysis circuit 121, and the fail information of the channel B may be transferred to the third repair analysis circuit 123.

In the 4-channel all mode 4CH_ALL, one repair analysis circuit is used for each channel. Thus, the first fail information CMP_FAIL0[3:0] may be generated as CMP_FAIL[3:0][a], the second fail information CMP_FAIL1[3:0] may be generated as CMP_FAIL[3:0][b], the third fail information CMP_FAIL2[3:0] may be generated as CMP_FAIL[3:0][c], and the fourth fail information CMP_FAIL3[3:0] may be generated as CMP_FAIL[3:0][d]. That is, the fail information of the channel A may be transferred to the first repair analysis circuit 121, the fail information of the channel B may be transferred to the second repair analysis circuit 122, the fail information of the channel C may be transferred to the third repair analysis circuit 123, and the fail information of the channel D may be transferred to the fourth repair analysis circuit 124.

Depending on the modes, the first to fourth repair analysis circuits 121 to 124 may operate independently or operate like one repair analysis circuit, and thus efficiently analyze and store fail addresses.

Figure 5:
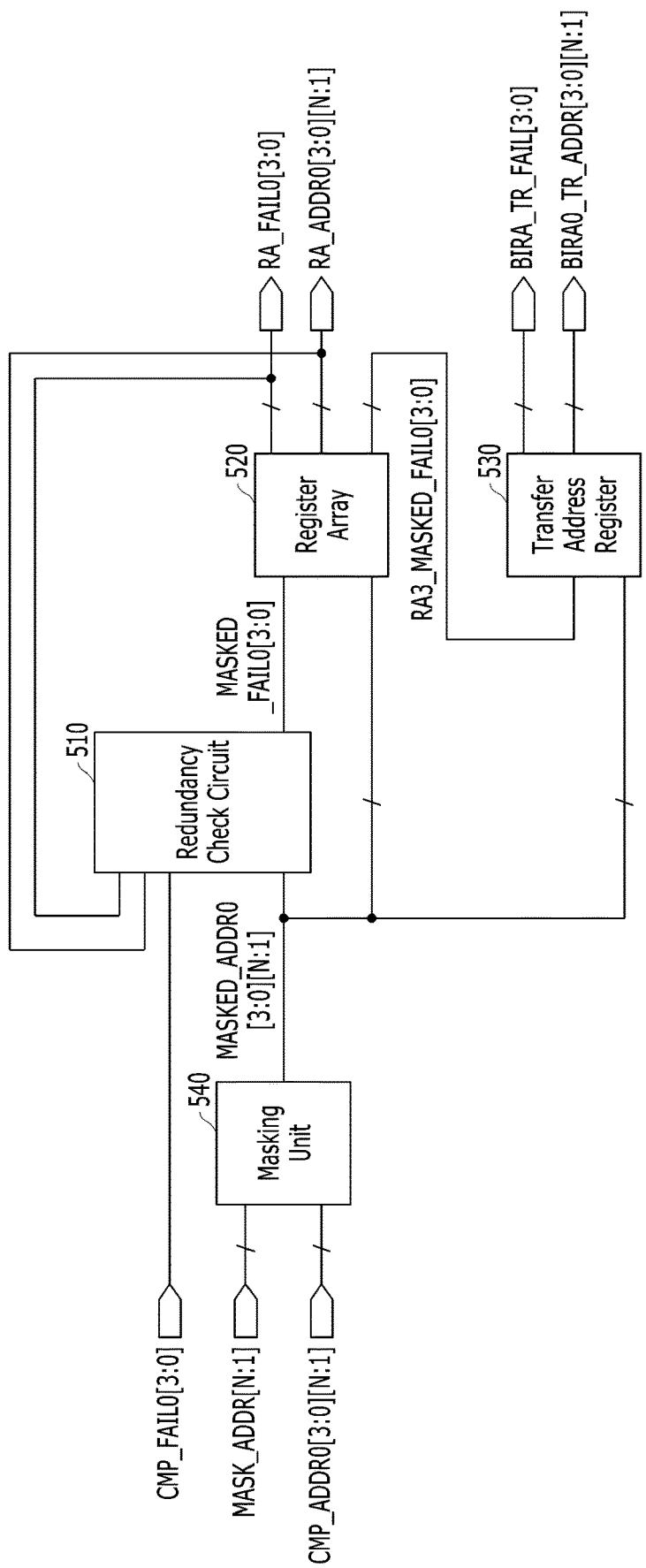
FIG. 5 is a configuration diagram illustrating an embodiment of a first repair analysis circuit of FIG. 1.

FIG. 5 is a configuration diagram illustrating an embodiment of the first repair analysis circuit 121 of FIG. 1. The second to fourth repair analysis circuits 122 to 124 may be configured in the same manner as illustrated in FIG. 5.

Referring to FIG. 5, the first repair analysis circuit 121 may include a redundancy check circuit 510, a register array 520, a transfer address register 530 and a masking unit 540.

The masking unit 540 may mask some bits of the address set CMP_ADDR0[3:0][N:1] inputted to the first repair analysis circuit 121.

The masking operation may be performed by masking information MASK_ADDR[N:1]. Depending on how repair units of the memory are configured, a part of the fail addresses needs to be set to a don't-care state. For this operation, the masking unit 540 may be provided. Since the masking operation is not essential for the operation of the first repair analysis circuit 121, the masking unit 540 can be omitted from the first repair analysis circuit 121. The address set MASKED_ADDR0[3:0][N:1] masked by the masking unit 540 may be transferred to the redundancy check circuit 510, the register array 520 and the transfer address register 530.

The redundancy check circuit 510 may check whether a fail address inputted to the first repair analysis circuit 121 is redundant or same as a fail address which is already stored in the register array 520. The fail address inputted to the first repair analysis circuit 121 may indicate a fail address expressed by the first fail information CMP_FAIL0[3:0] and the masked address set MASKED_ADDR0[3:0][N:1], and the fail address which is already stored in the register array 520 may indicate a fail address expressed by first stored fail information RA_FAIL0[3:0] and a first stored address set RA_ADDR0[3:0][N:1]. The redundancy check circuit 510 may output masked fail information MASKED_FAIL0[3:0]. The redundancy check circuit 510 may generate the masked fail information MASKED_FAIL0[3:0] by deactivating the first fail information CMP_FAIL0[3:0] when the input fail address is equal to the fail address which is already stored, or when the input fail address does not need to be stored in the register array 520. When the input fail address is different from the fail address which is already stored or when the input fail address needs to be stored in the register array 520, the masked fail information MASKED_FAIL0[3:0] may be equal to the first fail information CMP_FAIL0[3:0].

The register array 520 may store the fail address expressed by the masked fail information MASKED_FAIL0[3:0] and the masked address set MASKED_ADDR0[3:0][N:1]. The register array 520 may include a plurality of repair address registers, and each of the repair address registers may store the fail address. The first stored fail information RA_FAIL0[3:0] and the first stored address set RA_ADDR0[3:0][N:1], outputted from the register array 520, may indicate the fail address stored in the register array 520. Furthermore, fourth register fail information RA3_MASKED_FAIL0[3:0] outputted from the register array 520 may be fail information indicating a fail address which the register array 520 does not store.

The transfer address register 530 may receive and store the fourth register fail information RA3_MASKED_FAIL0[3:0] and the masked address set MASKED_ADDR0[3:0][N:1], and output the stored information and address set as the first transfer fail information BIRA0_TR_FAIL[3:0] and the first transfer address set BIRA0_TR_ADDR[3:0][N:1]. The first transfer fail information BIRA0_TR_FAIL[3:0] and the first transfer address set BIRA0_TR_ADDR[3:0][N:1] may indicate a fail address which needs to be stored in the register array 520, but is not stored in the register array 520 because the storage capacity of the register array 520 is full.

Figure 6:
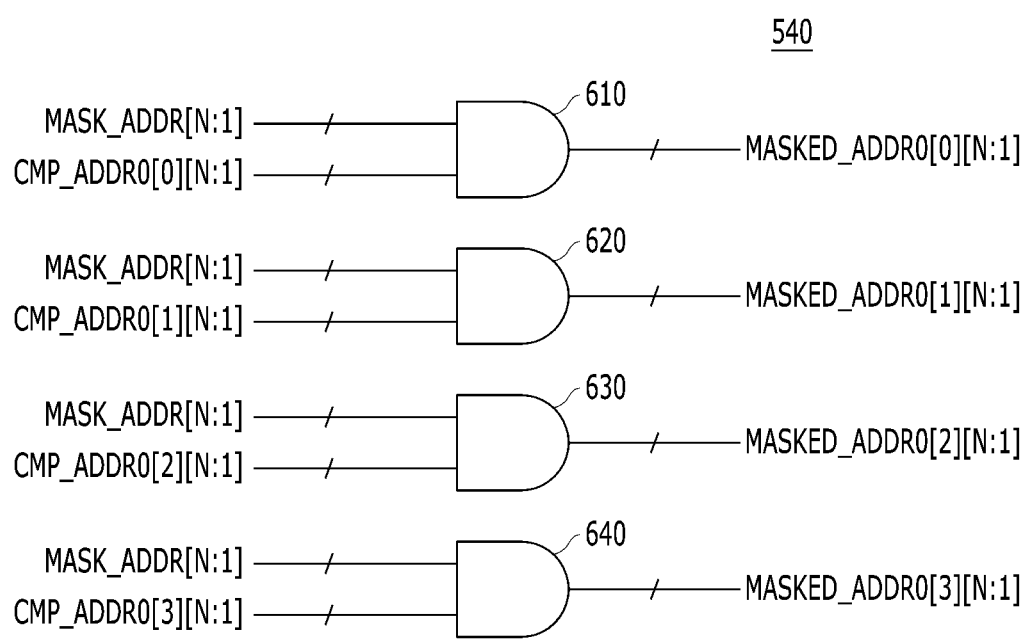
FIG. 6 is a configuration diagram illustrating an embodiment of a masking unit of FIG. 5.

FIG. 6 is a configuration diagram illustrating an embodiment of the masking unit 540 of FIG. 5.

Referring to FIG. 6, the masking unit 540 may include a plurality of AND gates 610 to 640. The plurality of AND gates 610 to 640 may generate the masked address set MASKED_ADDR0[3:0][N:1] by performing an AND operation on the masking information MASK_ADDR[N:1] and the address set CMP_ADDR0[3:0][N:1]. For example, MASKED_ADDR0[2][N] of the masked address set may be generated through an AND operation on MASK_ADDR[N] and CMP_ADDR0[2][N], and MASKED_ADDR0[1][3] of the masked address set may be generated through an AND operation on MASK_ADDR[3] and CMP_ADDR0[1][3].

In FIG. 6, each of the AND gates 610 to 640 may indicate N AND gates. That is, the masking unit 540 may include 4*N AND gates.

Figure 7:
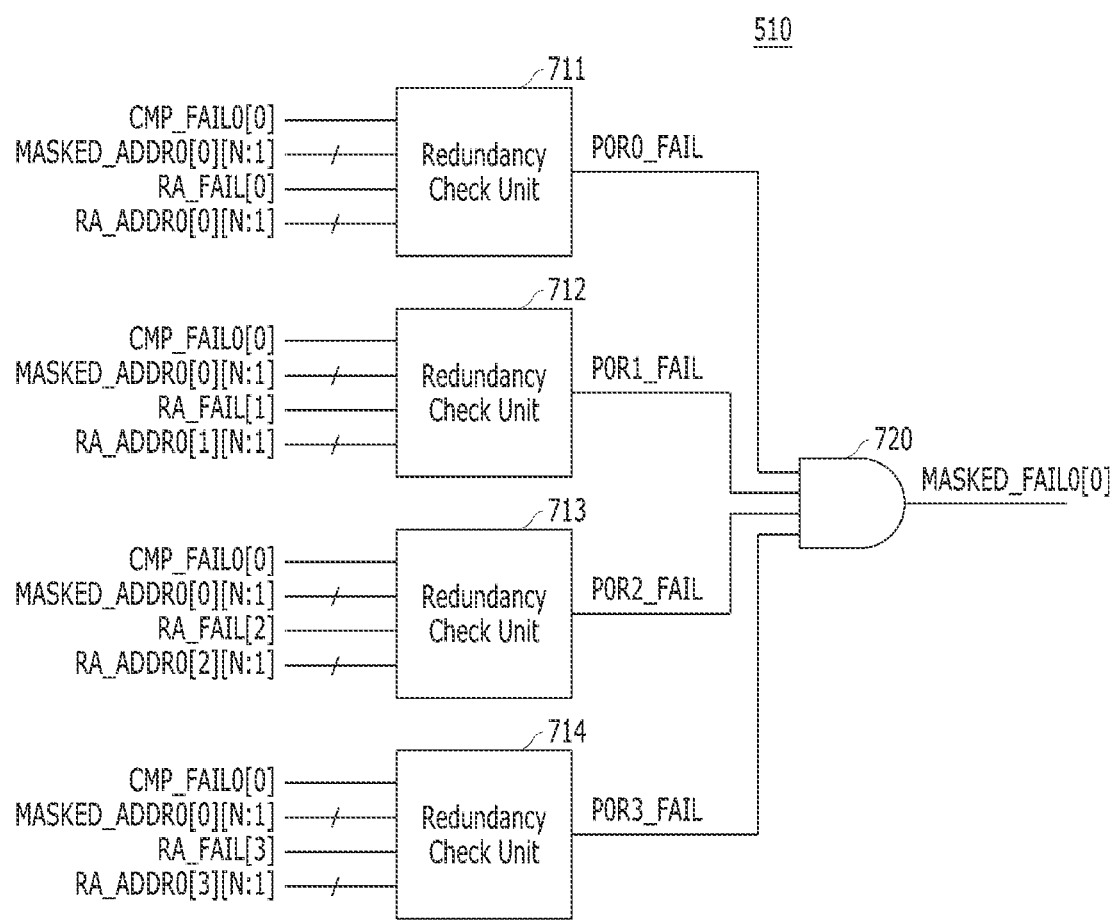
FIGS. 7 to 10 are configuration diagrams illustrating an embodiment of a redundancy check circuit.
Figure 8:
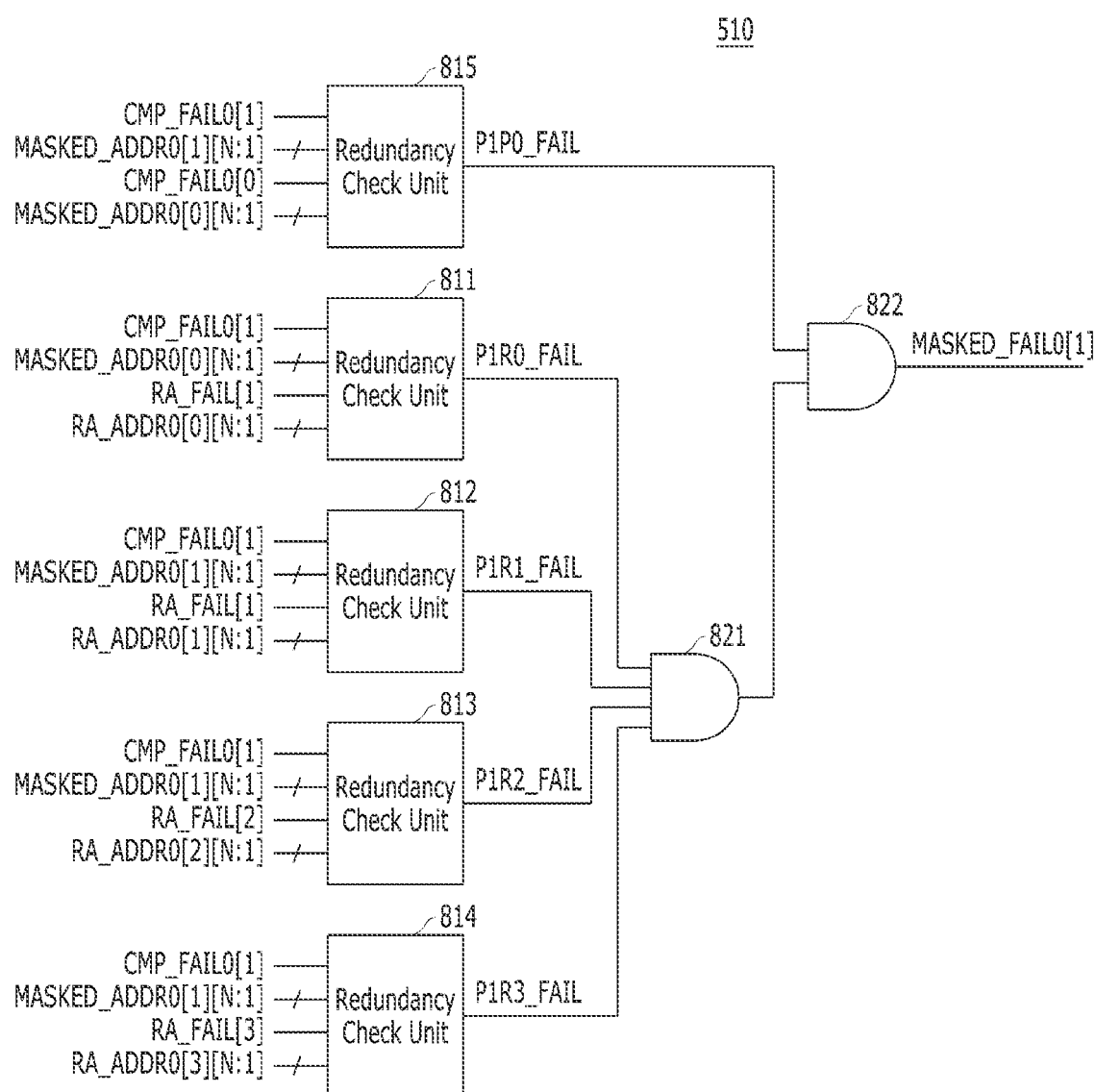
Figure 9:
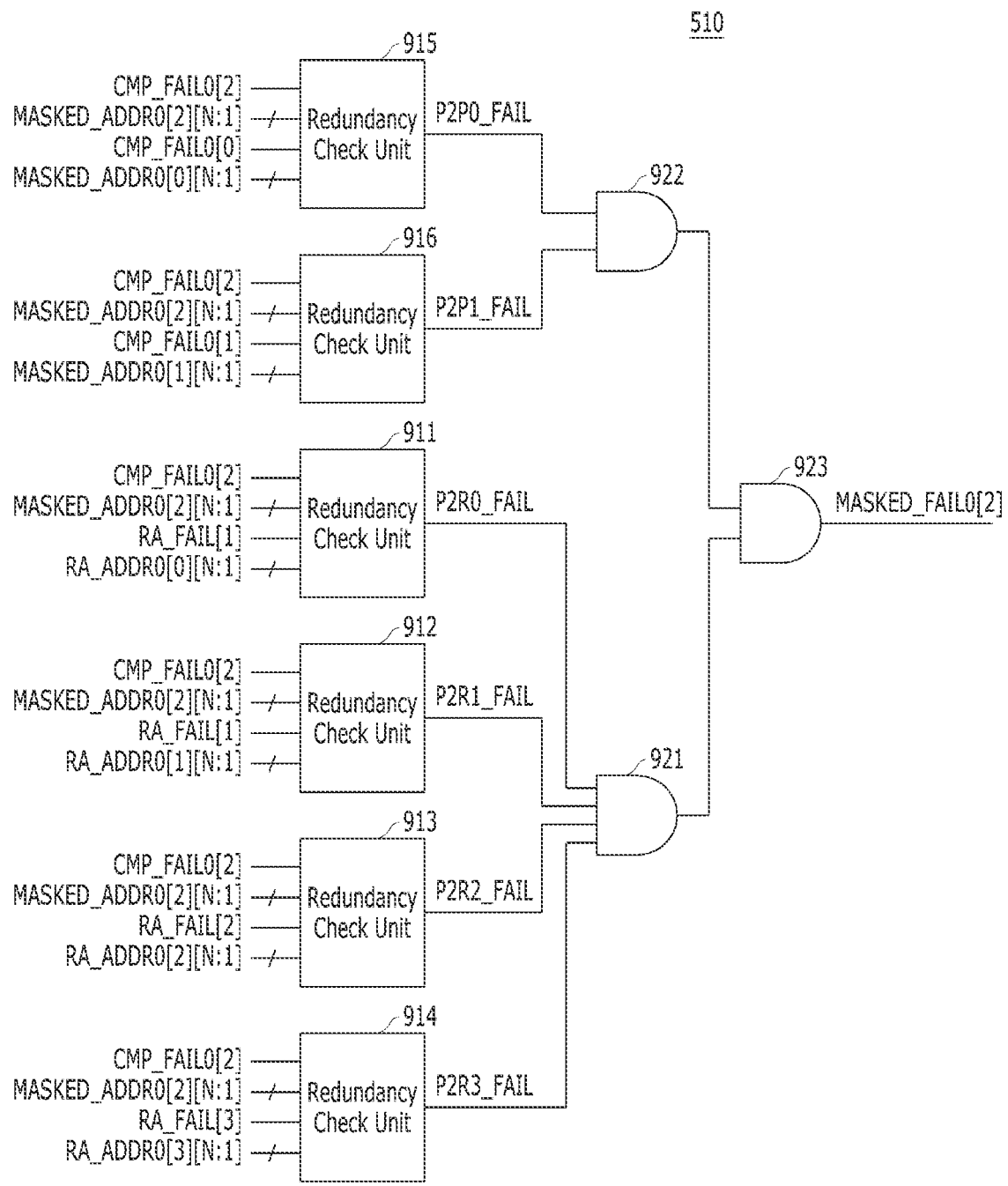
Figure 10:
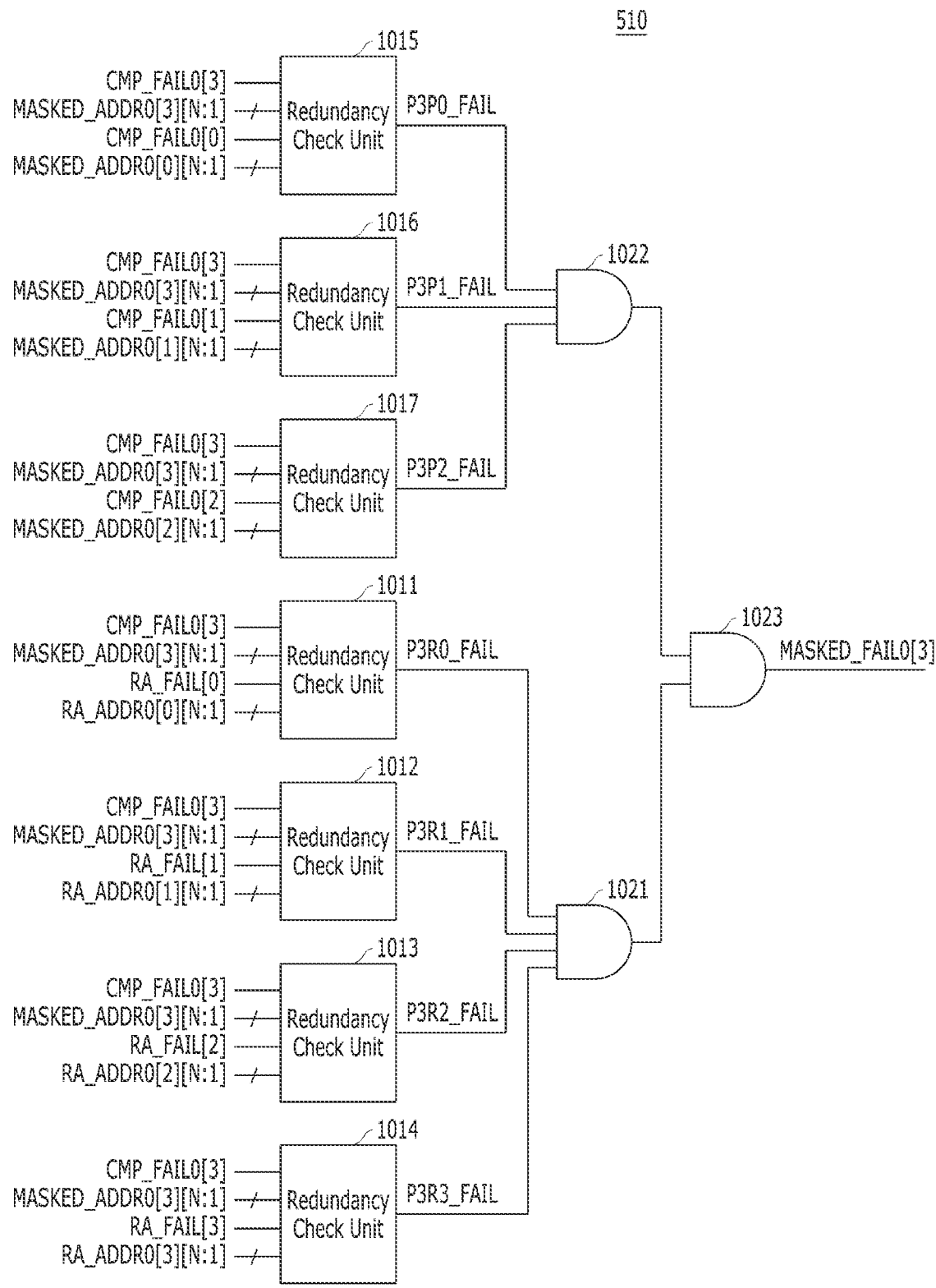

FIGS. 7 to 10 are configuration diagrams illustrating an embodiment of the redundancy check circuit 510. FIG. 7 is a configuration diagram illustrating a part for generating MASKED_FAIL0[0] of the masked fail information MASKED_FAIL0[3:0] in the redundancy check circuit 510 of FIG. 5, FIG. 8 is a configuration diagram illustrating a part for generating MASKED_FAIL0[1] of the masked fail information MASKED_FAIL0[3:0], FIG. 9 is a configuration diagram illustrating a part for generating MASKED_FAIL0[2] of the masked fail information MASKED_FAIL0[3:0], and FIG. 10 is a configuration diagram illustrating a part for generating MASKED_FAIL0[3] of the masked fail information MASKED_FAIL0[3:0].

Referring to FIG. 7, the redundancy check circuit 510 may include four redundancy check units 711 to 714 and an AND gate 720 in order to generate MASKED_FAIL0[0].

The redundancy check units 711 to 714 may check whether two input fail addresses are redundant or same as each other. For example, the redundancy check unit 711 may check whether a fail address expressed as CMP_FAIL0[0] of the first fail information CMP_FAIL0[3:0] and MASKED_ADDR0[0][N:1] of the masked address set MASKED_ADDR0[3:0][N:1] is redundant or same as a fail address expressed as RA_FAIL0[0] of the first stored fail information RA_FAIL0[3:0] and RA_ADDR0[0][N:1] of the first stored address set RA_ADDR0[3:0][N:1]. The redundancy check unit 711 may generate and output an output signal P0R0_FAIL thereof as '0' when CMP_FAIL0[0] is '0', and generate and output the output signal P0R0_FAIL as '1' when CMP_FAIL0[0] is '1' and RA_FAIL0[0] is '0'. Furthermore, when CMP_FAIL0[0] is '1' and RA_FAIL0[0] is '1', the redundancy check unit 711 may generate the output signal P0R0_FAIL as '0' in the case that MASKED_ADDR0[0][N:1] and RA_ADDR0[0][N:1] are equal to each other, and generate the output signal P0R0_FAIL as '1' in the case that MASKED_ADDR0[0][N:1] and RA_ADDR0[0][N:1] are different from each other. When the output signal P0R0_FAIL is '0', it may indicate that a fail address expressed as CMP_FAIL0[0] and MASKED_ADDR0[0][N:1] is not present, or the fail address expressed as CMP_FAIL0[0] and MASKED_ADDR0[0][N:1] is present but equal to the fail address stored in a first repair address register 1210 of the register array 520. Furthermore, when the output signal P0R0_FAIL is '1', it may indicate that the fail address expressed as CMP_FAIL0[0] and MASKED_ADDR0[0][N:1] is present and different from the fail address stored in the first repair address register 1210.

The redundancy check units 712 to 714 may generate the output signals P0R1_FAIL, P0R2_FAIL and P0R3_FAIL in the same manner as the redundancy check unit 711.

The AND gate 720 may generate MASKED_FAIL0[0] by performing an AND operation on the output signals P0R0_FAIL, P0R1_FAIL, P0R2_FAIL and P0R3_FAIL.

When MASKED_FAIL0[0] is '0', it may indicate that the fail address expressed as CMP_FAIL0[0] and MASKED_ADDR0[0][N:1] does not need to be stored in the register array 520. This case may indicate that a valid fail address expressed as CMP_FAIL0[0] and MASKED_ADDR0[0][N:1] is not present or already stored in the register array 520.

When MASKED_FAIL0[0] is '1', it may indicate that the fail address expressed as CMP_FAIL0[0] and MASKED_ADDR0[0][N:1] needs to be stored in the register array 520. This case may indicate that the valid fail address expressed as CMP_FAIL0[0] and MASKED_ADDR0[0][N:1] is not stored in the register array 520.

Referring to FIG. 8, the redundancy check circuit 510 may include five redundancy check units 811 to 815 and two AND gates 821 and 822 in order to generate MASKED_FAIL0[1]. The redundancy check units 711 to 714 of FIG. 7 have checked whether the fail address expressed as CMP_FAIL0[0] of the first fail information CMP_FAIL0[3:0] and MASKED_ADDR0[0][N:1] of the masked address set MASKED_ADDR0[3:0][N:1] is redundant or same as the fail address stored in the register array 520. Similarly, the redundancy check units 811 to 814 of FIG. 8 may check whether the fail address expressed as CMP_FAIL0[1] of the first fail information CMP_FAIL0[3:0] and MASKED_ADDR0[1][N:1] of the masked address set MASKED_ADDR0[3:0][N:1] is redundant or same as the fail address stored in the register array 520. Furthermore, the redundancy check unit 815 of FIG. 8 may check whether a fail address expressed as CMP_FAIL0[1] and MASKED_ADDR0[1][N:1] is redundant or same as the fail address expressed as CMP_FAIL0[0] and MASKED_ADDR0[0][N:1]. That is, the redundancy check unit 815 may check whether a fail address inputted to the port 0 and a fail address inputted to the port 1 are redundant or same as each other. The two AND gates 821 and 822 may generate MASKED_FAIL0[1] by performing an AND operation on output signals P1R0_FAIL, P1R1_FAIL, P1R2_FAIL, P1R3_FAIL and P1P0_FAIL of the redundancy check units 811 to 815 of FIG. 8.

Referring to FIG. 9, the redundancy check circuit 510 may include six redundancy check units 911 to 916 and three AND gates 921 to 923 in order to generate MASKED_FAIL0[2]. The redundancy check units 911 to 914 may check whether a fail address expressed as CMP_FAIL0[2] of the first fail information CMP_FAIL0[3:0] and MASKED_ADDR0[2][N:1] of the masked address set MASKED_ADDR0[3:0][N:1] is redundant or same as a fail address stored in the register array 520. The redundancy check unit 915 may check whether the fail address expressed as CMP_FAIL0[2] and MASKED_ADDR0[2][N:1] is redundant or same as the fail address expressed as CMP_FAIL0[0] and MASKED_ADDR0[0][N:1], and the redundancy check unit 916 may check whether the fail address expressed as CMP_FAIL0[2] and MASKED_ADDR0[2][N:1] is redundant or same as the fail address expressed as CMP_FAIL0[1] and MASKED_ADDR0[1][N:1]. The three AND gates 921 to 923 may generate MASKED_FAIL0[2] by performing an AND operation on output signals P2R0_FAIL, P2R1_FAIL, P2R2_FAIL, P2R3_FAIL, P2P0_FAIL and P2P1_FAIL of the redundancy check units 911 to 916 of FIG. 9.

Referring to FIG. 10, the redundancy check circuit 510 may include seven redundancy check units 1011 to 1017 and three AND gates 1021 to 1023 in order to generate MASKED_FAIL0[3]. The redundancy check units 1011 to 1014 may check whether a fail address expressed as CMP_FAIL0[3] of the first fail information CMP_FAIL0[3:0] and MASKED_ADDR0[3][N:1] of the masked address set MASKED_ADDR0[3:0][N:1] is redundant or same as a fail address stored in the register array 520. The redundancy check unit 1015 may check whether the fail address expressed as CMP_FAIL0[3] and MASKED_ADDR0[3][N:1] is redundant or same as the fail address expressed as CMP_FAIL0[0] and MASKED_ADDR0[0][N:1], the redundancy check unit 1016 may check whether the fail address expressed as CMP_FAIL0[3] and MASKED_ADDR0[3][N:1] is redundant or same as the fail address expressed as CMP_FAIL0[1] and MASKED_ADDR0[1][N:1], and the redundancy check unit 1017 may check whether the fail address expressed as CMP_FAIL0[3] and MASKED_ADDR0[3][N:1] is redundant or same as the fail address expressed as CMP_FAIL0[2] and MASKED_ADDR0[2][N:1]. The three AND gates 1021 to 1023 may generate MASKED_FAIL0[3] by performing an AND operation on output signals P3R0_FAIL, P3R1_FAIL, P3R2_FAIL, P3R3_FAIL, P3P0_FAIL, P3P1_FAIL and P3P2_FAIL of the redundancy check units 1011 to 1017 of FIG. 10.

Figure 11:
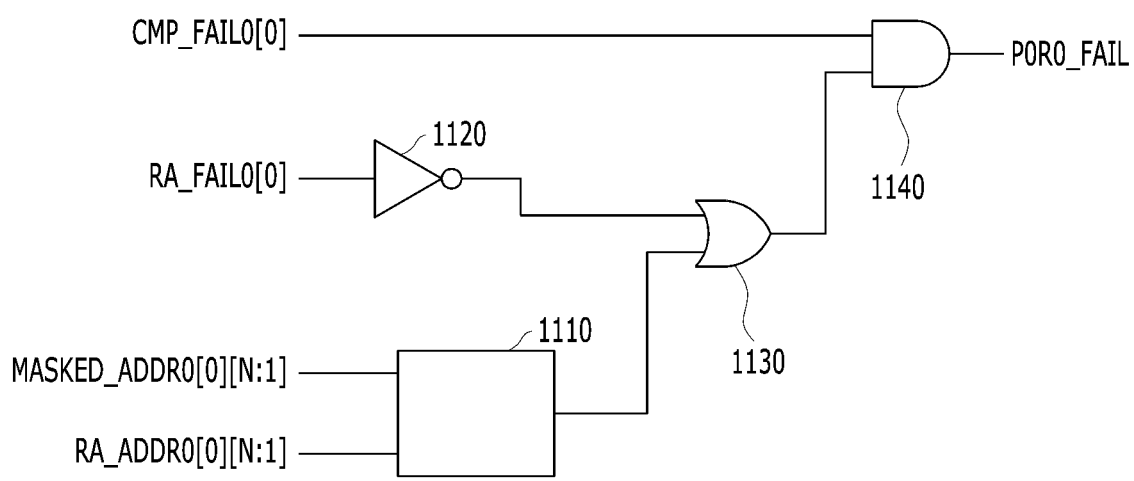
FIG. 11 is a configuration diagram illustrating an embodiment of a redundancy check unit of FIG. 7.

FIG. 11 is a configuration diagram illustrating an embodiment of the redundancy check unit 711 of FIG. 7. The other redundancy check units 712 to 714, 811 to 815, 911 to 916 and 1011 to 1017 illustrated in FIGS. 7 to 10 may have the same configuration as the redundancy check unit 711.

Referring to FIG. 11, the redundancy check unit 711 may include an identity determination unit 1110, an inverter 1120, an OR gate 1130 and an AND gate 1140.

The identity determination unit 1110 may receive MASKED_ADDR0[0][N:1] and RA_ADDR0[0][N:1], output '1' when MASKED_ADDR0[0][N:1] and RA_ADDR0 [0][N:1] are different from each other, and output '0' when MASKED_ADDR0[0][N:1] and RA_ADDR0[0][N:1] are equal to each other.

The inverter 1120 may invert and output RA_FAIL0[0], and the OR gate 1130 may perform an OR operation on the output of the inverter 1120 and the output of the identity determination unit 1110, and output the operation result. The AND gate 1140 may generate the output signal P0R0_FAIL by performing an AND operation on CMP_FAIL0[0] and the output of the OR gate 1130.

The redundancy check unit 711 may generate and output the output signal P0R0_FAIL as '0' when CMP_FAIL0[0] is '0', and generate and output the output signal P0R0_FAIL as '1' when CMP_FAIL0[0] is '1' and RA_FAIL0[0] is '0'. Furthermore, when CMP_FAIL0[0] is '1' and RA_FAIL0[0] is '1', the redundancy check unit 711 may generate the output signal P0R0_FAIL as '0' in the case that MASKED_ADDR0[0][N:1] and RA_ADDR0[0][N:1] are equal to each other, and generate the output signal P0R0_FAIL as '1' in the case that MASKED_ADDR0[0][N:1] and RA_ADDR0[0][N:1] are different from each other.

Figure 12:
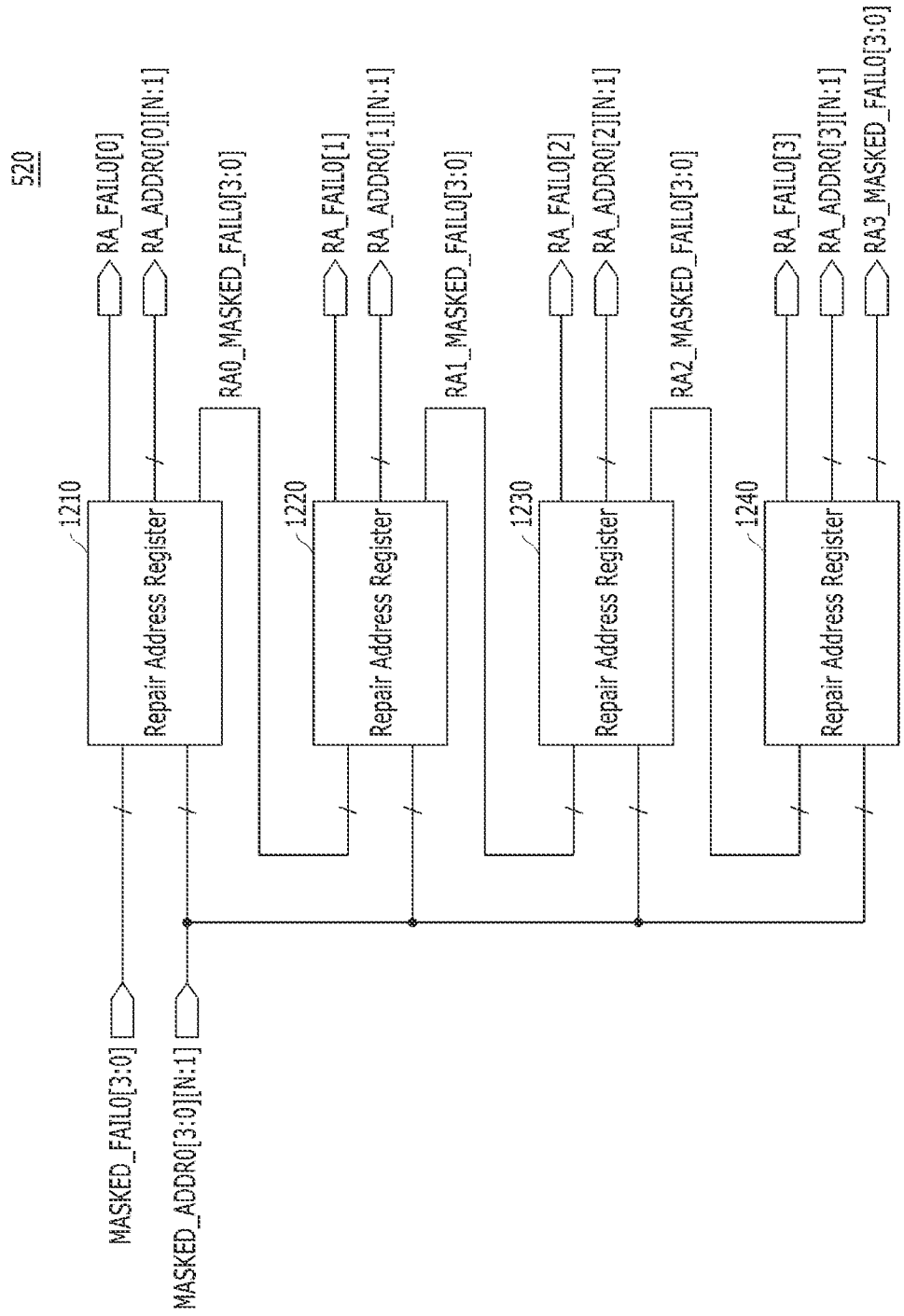
FIG. 12 is a configuration diagram illustrating an embodiment of a register array of FIG. 5.

FIG. 12 is a configuration diagram illustrating an embodiment of the register array 520 of FIG. 5.

Referring to FIG. 12, the register array 520 may include first to fourth repair address registers 1210 to 1240.

Each of the first to fourth repair address registers 1210 to 1240 may receive the masked address set MASKED_ADDR0[3:0][N:1]. The first repair address register 1210 may receive the masked fail information MASKED_FAIL0 [3:0]. The second repair address register 1220 may receive first register fail information RA0_MASKED_FAIL0[3:0] outputted from the first repair address register 1210, the third repair address register 1230 may receive second register fail information RA1_MASKED_FAIL0[3:0] outputted from the second repair address register 1220, and the fourth repair address register 1240 may receive third register fail information RA2_MASKED_FAIL0[3:0] outputted from the third repair address register 1230.

The first stored fail information RA_FAIL0[3:0] and the first stored address set RA_ADDR0[3:0][N:1], outputted from the first to fourth repair address registers 1210 to 1240, may indicate the fail addresses stored in the first to fourth repair address registers 1210 to 1240.

Each piece of the first to fourth register fail information RA0_MASKED_FAIL0[3:0], RA1_MASKED_FAIL0[3:0], RA2_MASKED_FAIL0[3:0] and RA3_MASKED_FAIL0[3:0] outputted from the first to fourth repair address registers 1210 to 1240 may be fail information obtained by masking the fail address, stored in the corresponding repair address register, in the input fail information. For example, the first repair address register 1210 may generate the first register fail information RA0_MASKED_FAIL0[3:0] by masking a fail address indicated in the masked fail information MASKED_FAIL0[3:0], when the fail address is stored in the first repair address register 1210. That is, when the first repair address register 1210 does not store the fail address indicated in the masked fail information MASKED_FAIL0[3:0], the masked fail information MASKED_FAIL0[3:0] and the first register fail information RA0_MASKED_FAIL0[3:0] may be equal to each other. When the first repair address register 1210 stores the fail address indicated in the masked fail information MASKED_FAIL0[3:0], the masked fail information MASKED_FAIL0[3:0] and the first register fail information RA0_MASKED_FAIL0[3:0] may be different from each other. Similarly, the third repair address register 1230 may generate the third register fail information RA2_MASKED_FAIL0[3:0] by masking a fail address indicated in the second register fail information RA1_MASKED_FAIL0[3:0], when the fail address is stored in the third repair address register 1230.

Each of the first to fourth repair address registers 1210 to 1240 may store a fail address which the repair address register at the previous stage does not store.

Figure 13:
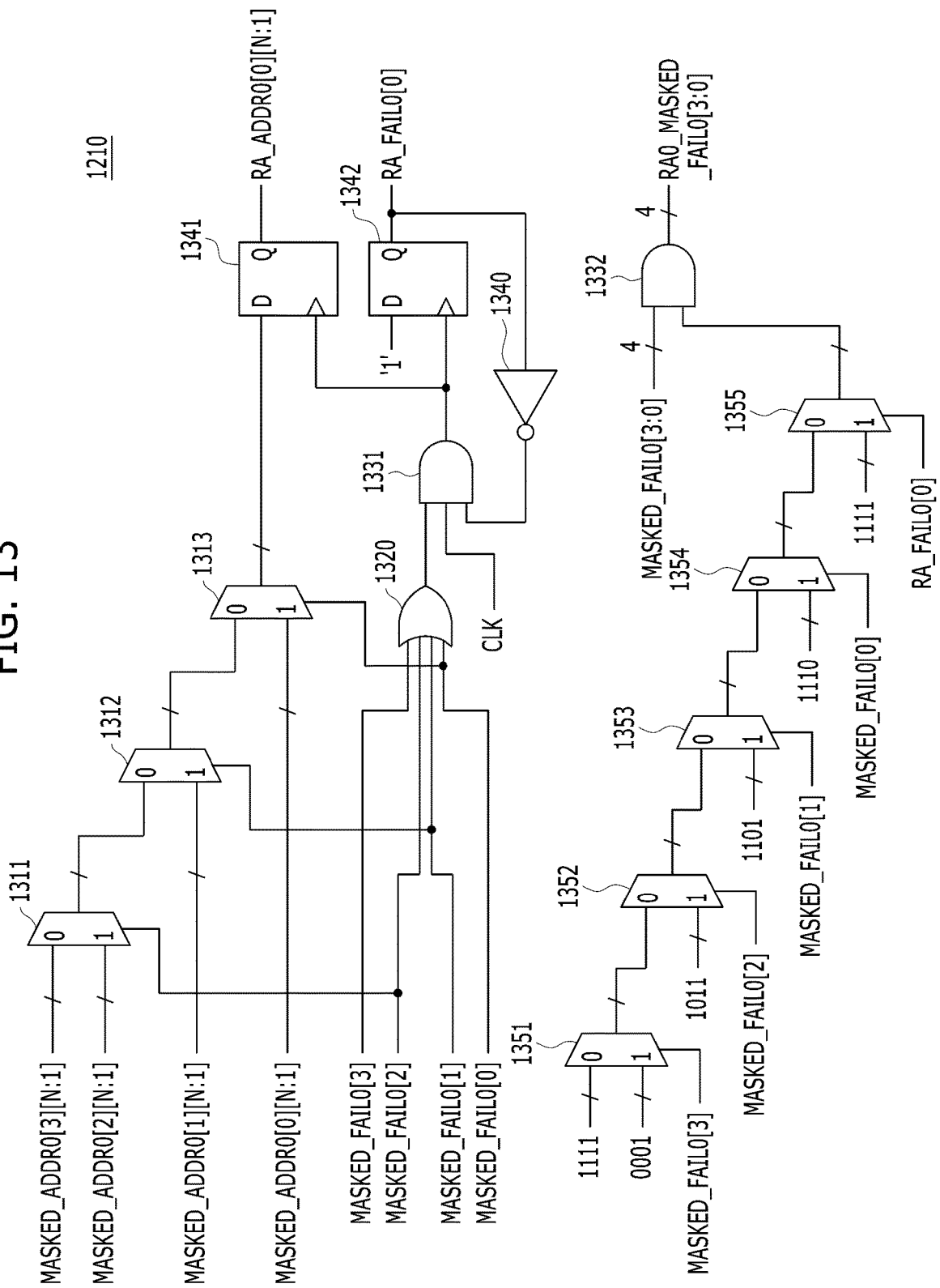
FIG. 13 is a configuration diagram illustrating an embodiment of a first repair address register of FIG. 12.

FIG. 13 is a configuration diagram illustrating an embodiment of the first repair address register 1210 of FIG. 12. The second to fourth repair address registers 1220 to 1240 may be configured in the same manner as the first repair address register 1210.

Referring to FIG. 13, the first repair address register 1210 may include first selection circuits 1311 to 1313, an OR gate 1320, AND gates 1331 and 1332, D flip-flops 1341 and 1342, an inverter 1340 and second selection circuits 1351 to 1355.

The first selection circuits 1311 to 1313 may perform a selection operation in response to MASKED_FAIL0[0], MASKED_FAIL0[1] and MASKED_FAIL0[2]. For example, the first selection circuit 1311 may select and output MASKED_ADDR0[3] when MASKED_FAIL0[2] is '0', and select and output MASKED_ADDR0[2] when MASKED_FAIL0[2] is '1'. The first selection circuits 1311 to 1313 may transfer MASKED_ADDR0[0] to the D flip-flop 1341 when MASKED_FAIL0[0] is '1', transfer MASKED_ADDR0[1] to the D flip-flop 1341 when MASKED_FAIL0[1] is '1', transfer MASKED_ADDR0[2] to the D flip-flop 1341 when MASKED_ADDR0[2] is '1', and transfer MASKED_ADDR0[3] to the D flip-flop 1341 when MASKED_FAIL0[3] is '1'. When the number of bits having a value of '1' in the masked fail information MASKED_FAIL0[3:0] is equal to or greater than two, a low-order bit has a priority. For example, when MASKED_FAIL0[1] and MASKED_FAIL0[2] are '1', the first selection circuits 1311 to 1313 may transfer MASKED_ADDR0 [1] to the D flip-flop 1341.

The OR gate 1320 may perform an OR operation on the masked fail information MASKED_FAIL0[3:0], and output the operation result. The inverter 1340 may invert and output RA_FAIL0[0] outputted from the D flip-flop 1342. The AND gate 1331 may perform an AND operation on the output signal of the OR gate 1320, the output signal of the inverter 1340 and a clock CLK, and output the operation result. The output signal of the AND gate 1332 may be activated when the output signal of the OR gate 1320 is '1', the clock CLK is '1' and RA_FAIL0[0] is '0'. When the output signal of the AND gate 1332 is activated, the D flip-flop 1342 may receive and store '1', and the D flip-flop 1341 may receive and store an output of the first selection circuit 1313. FIG. 13 illustrates the D flip-flop 1341 as one D flip-flop, but the D flip-flop 1341 may indicate N D flip-flops.

The second selection circuits 1351 to 1355 may perform a selection operation in response to the masked fail information MASKED_FAIL0[3:0] and RA_FAIL0[0]. Specifically, '1111' may be transferred to the AND gate 1332 when RA_FAIL0[0] is '1', '1110' may be transferred to the AND gate 1332 when MASKED_FAIL0[0] is '1', '1101' may be transferred to the AND gate 1332 when MASKED_FAIL0 [1] is '1', '1011' may be transferred to the AND gate 1332 when MASKED_FAIL0[2] is '1', and '0111' may be transferred to the AND gate 1332 when MASKED_FAIL0[3] is '1'. When the masked fail information and RA_FAIL0[0] both have a value of '1', RA_FAIL0[0], MASKED_FAIL0 [0], MASKED_FAIL0[1], MASKED_FAIL0[2] and MASKED_FAIL0[3] sequentially have priorities. For example, when MASKED_FAIL0[0] and MASKED_FAIL0 [3] are '1', '1110' may be transferred to the AND gate 1332.

The AND gate 1332 may generate the first register fail information RA0_MASKED_FAIL0[3:0] by performing an AND operation on the masked fail information MASKED_FAIL0[3:0] and the information transferred from the second selection circuits 1351 to 1355.

Figure 14:
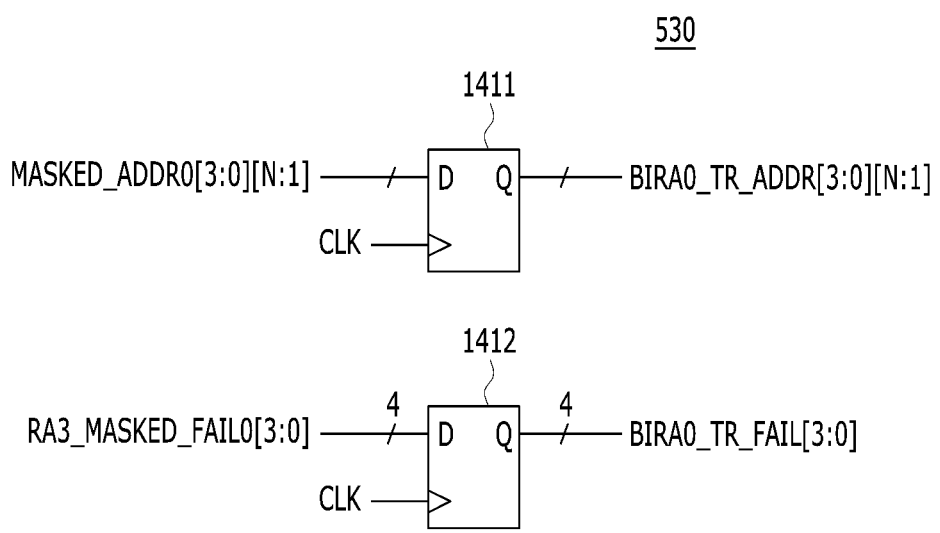
FIG. 14 is a configuration diagram illustrating an embodiment of a transfer address register of FIG. 5.

FIG. 14 is a configuration diagram illustrating an embodiment of the transfer address register 530 of FIG. 5.

Referring to FIG. 14, the transfer address register 530 may include D flip-flops 1411 and 1412.

The D flip-flop 1411 may receive and store the masked address set MASKED_ADDR0[3:0] in synchronization with the clock CLK, and output the stored address set as the first transfer address set BIRA0_TR_ADDR[3:0][N:1]. FIG. 14 illustrates the D flip-flop 1411 as one D flip-flop, but the D flip-flop 1411 may indicate N*4 D flip-flops.

The D flip-flop 1412 may receive and store the fourth register fail information RA3_MASKED_FAIL0[3:0] in synchronization with the clock CLK, and output the stored information as the first transfer fail information BIRA0_TR_FAIL[3:0]. FIG. 14 illustrates the D flip-flop 1412 as one D flip-flop, but the D flip-flop 1412 may indicate four D flip-flops.

Although various embodiments have been described for illustrative purposes, it will be apparent to those skilled in the art that various changes and modifications may be made without departing from the spirit and scope of the invention as defined in the following claims.

What is claimed is:

1. A memory comprising:
a first repair analysis circuit suitable for storing an input fail address when the input fail address is different from a fail address which is already stored in the first repair analysis circuit, and outputting the input fail address as a first transfer fail address when a storage capacity of the first repair analysis circuit is full; and
a second repair analysis circuit suitable for storing the first transfer fail address when the first transfer fail address is different from a fail address which is already stored in the second repair analysis circuit.

2. The memory of claim 1,
wherein the second repair analysis circuit outputs the first transfer fail address as a second transfer fail address when a storage capacity of the second repair analysis circuit is full, and
wherein the memory further comprises a third repair analysis circuit suitable for storing the second transfer fail address when the second transfer fail address is different from a fail address which is already stored in the third repair analysis circuit.

3. The memory of claim 1, wherein the first repair analysis circuit comprises:
a plurality of repair address registers; and
a redundancy check circuit suitable for determining whether to store the input fail address in the repair address registers based on whether the input fail address is same as one of fail addresses already stored in the plurality of repair address registers,
wherein the plurality of repair address registers store the input fail address based on the determination, and output the input fail address as the first transfer fail address when the storage capacity of the repair address registers are full, regardless of the determination.

* * * * *